United States Patent [19]
Uchida

[11] Patent Number: 5,625,596
[45] Date of Patent: Apr. 29, 1997

[54] SEMICONDUCTOR MEMORY DEVICE WITH IMPROVED OPERATING SPEED

[75] Inventor: Toshiya Uchida, Kawasaki, Japan

[73] Assignee: Fujitsu Limited, Kawasaki, Japan

[21] Appl. No.: 493,452

[22] Filed: Jun. 23, 1995

[30] Foreign Application Priority Data

Sep. 9, 1994 [JP] Japan .................................. 6-215917

[51] Int. Cl.$^6$ ...................................................... G11C 7/00
[52] U.S. Cl. ............................................ 365/200; 371/10.2
[58] Field of Search ........................... 365/200; 371/10.2, 371/10.3

[56] References Cited

U.S. PATENT DOCUMENTS

| | | | |
|---|---|---|---|
| 4,803,656 | 2/1989 | Takemae | 365/200 |
| 4,858,192 | 8/1989 | Tatsumi et al. | 365/200 |
| 5,097,447 | 3/1992 | Ogawa et al. | 365/200 |
| 5,206,831 | 4/1993 | Wakamatsu | 365/200 |

*Primary Examiner*—Son T. Dinh
*Attorney, Agent, or Firm*—Armstrong, Westerman, Hattori, McLeland & Naughton

[57] ABSTRACT

A semiconductor memory device having a plurality of operating modes, and which offers improved operating speed without an increase in the chip surface area. The semiconductor memory device according to the present invention has access mode in which access is made in accordance with an external address signal, as well as at least one access mode in which access is performed of an internally generated address position, this semiconductor memory device further having a normal memory cell array, a redundancy memory cell array, a redundancy determining circuit which makes a determination of whether an address position to actually be accessed by a plurality of modes is an exchanged memory cell and which performs control so as to access that memory cell, a mode determining circuit which determines the mode, and an internal address generating circuit which internally and automatically generates an address position. In the semiconductor memory device configured this manner, at least part of the mode determination and the redundancy determination is performed in parallel.

7 Claims, 13 Drawing Sheets

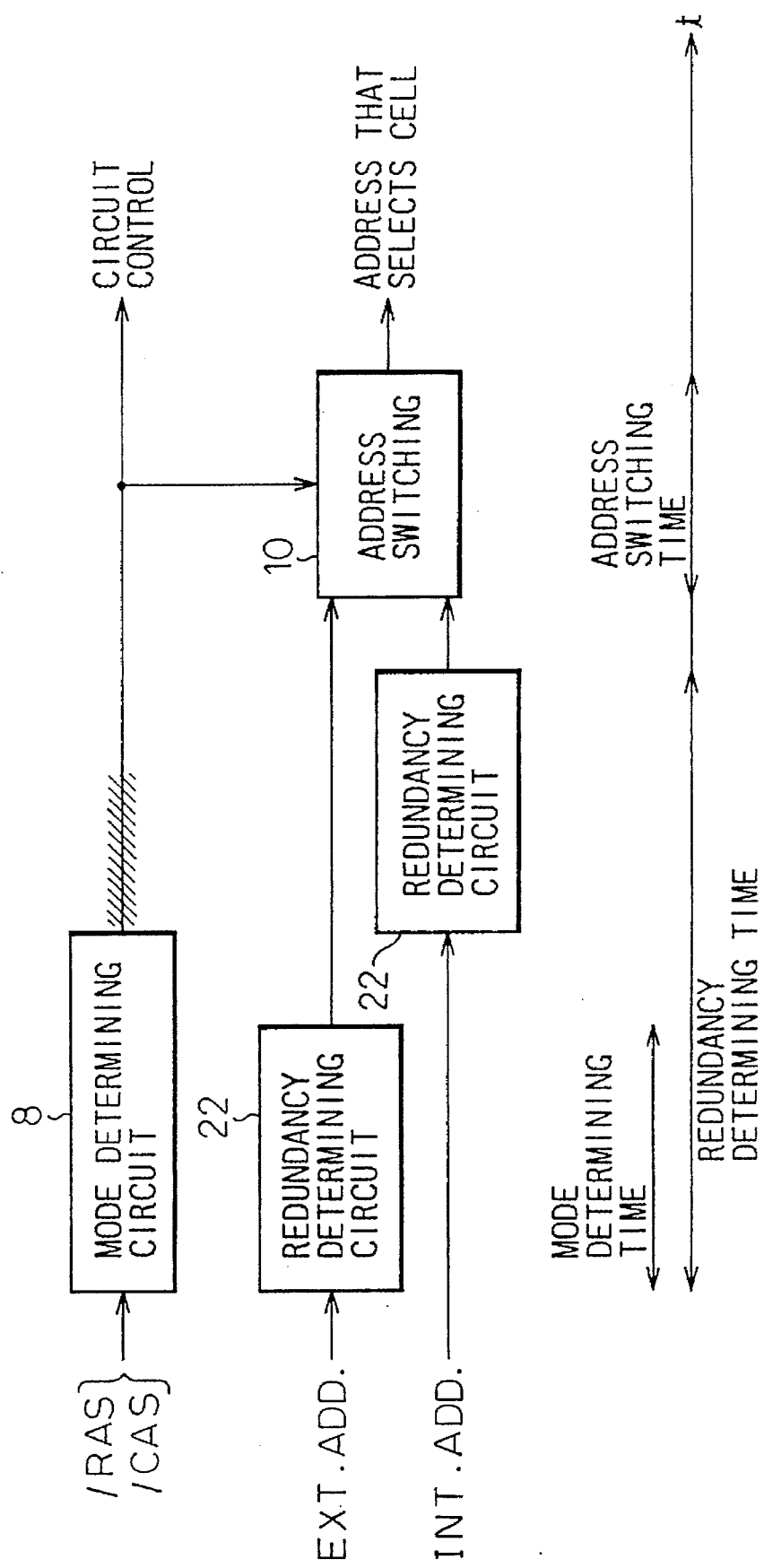

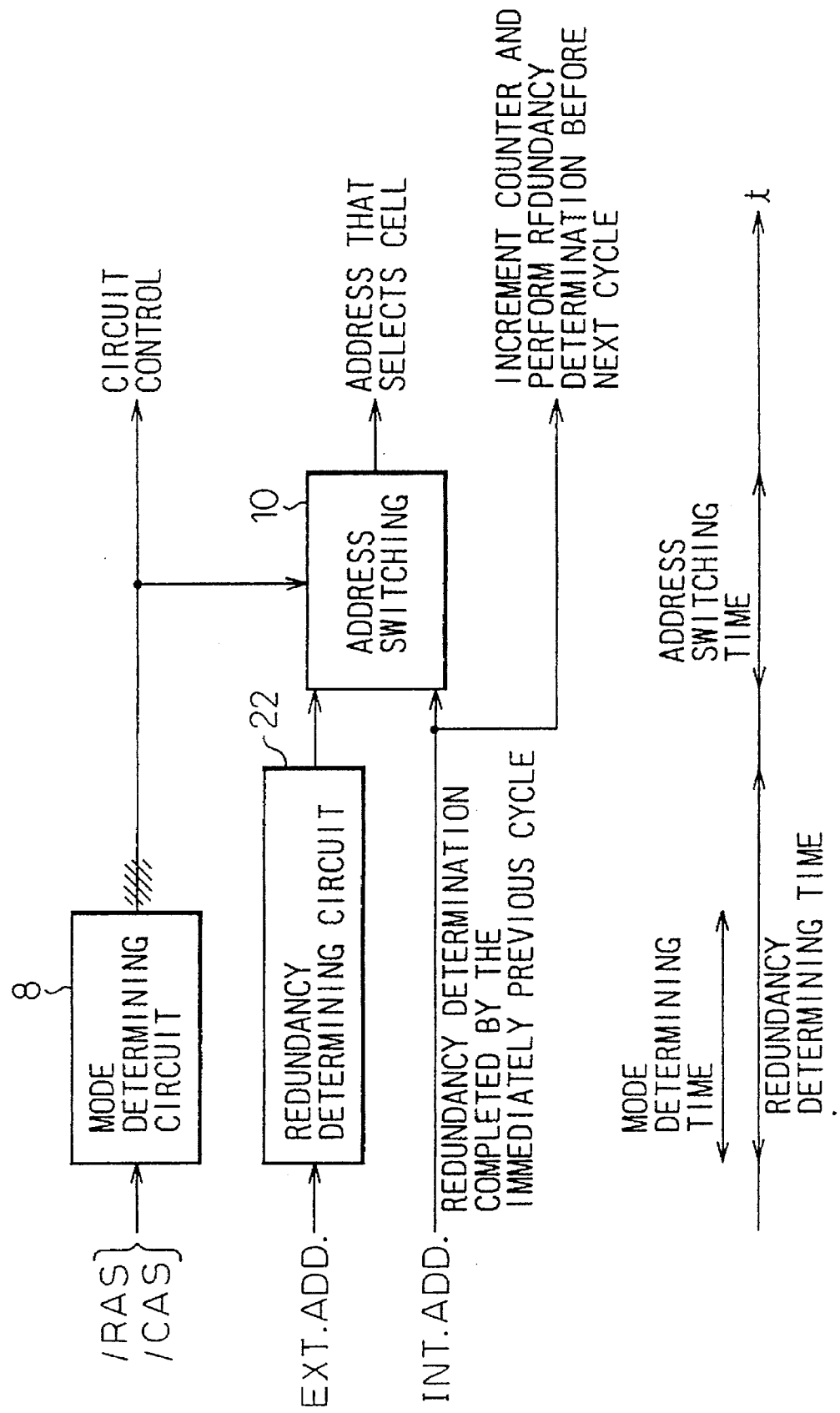

SEMICONDUCTOR MEMORY DEVICE WITH IMPROVED OPERATING SPEED

BACKGROUND OF THE INVENTION

1. Field of the Invention

The present invention relates to a semiconductor memory device, and more particularly to a semiconductor memory device which not only has a redundant memory cell for the purpose of replacing defective cells, but also has a mode in which address positions are accessed by means of instructions from an external address signal, and a mode in which internally generated address positions are accessed in accordance with prescribed data.

2. Description of the Related Art

In a semiconductor memory device, because of the nature of the manufacturing process, it is difficult to achieve a zero level of defective cells. Because classification of a chip in which defective cells have occurred as a bad chip would lower the manufacturing yield, the general approach is to apply redundancy technology, in which spare memory cells known as redundancy memory cells are provided beforehand, these being exchanged for defective memory cells occurring in the normal memory cell array, enabling the device to be used as a good chip, thereby improving the yield.

Semiconductor memory devices have a variety of operating modes. In a DRAM, for example, it is necessary to perform a refresh operation at a prescribed interval in order to refresh the contents of the memory, and while in the past the refresh address signal required for the refresh operation was externally input, to reduce the number of external components, in recent years it has become common to have an internal refresh address signal generating circuit to generate the refresh address. To perform a refresh operation in a DRAM having such an internal refresh address generating circuit, an externally input control signal is set to a state which differs from the state in the normal mode, the DRAM sensing the difference in the state of this control signal and performing the refresh operation. Therefore, the DRAM has a circuit which distinguishes between the normal mode and the refresh mode.

Additionally, DRAMs have special modes known as burst modes or nibble modes, in which data from a number of continuous addresses are read out at high speed. In these modes, a number of bits are continuously read out by internally generating continuous addresses with respect to an address externally specified at a given cycle.

In a semiconductor memory device making use of redundancy technology and also having various operating modes, a three-stage operation occurs, in which the mode switching circuit first determines the mode from the clock signal and the control signals such as the/CAS signal, after which an address switching circuit selects, depending upon the mode, either the external address or the internally generated address, followed by a determination being made by a redundancy determining circuit as to whether the address selected by the address switching circuit is an exchanged address.

In a semiconductor memory device, to raise the manufacturing yield, it is desired to improve the operating speed. To improve the operating speed, a synchronous DRAM of the type described above has been proposed, and in the operational flow of semiconductor memory devices in the past, the determination of the operating mode followed by a determination of redundancy. Therefore, the time actually required to achieve access is the total of the mode determining time, the address switching time, and the redundancy determining time, making it necessary to shorten these times in order to improve the operating speed of the semiconductor memory device.

In this regard, Japanese Unexamined Patent Application Publication No. 2-83899 discloses a semiconductor memory device which, in a serial access memory, by performing a redundancy determination on the serial access address on previous cycle, the operating speed in the serial access mode is improved. However, because conventional operation is performed in the normal mode, it was not possible with this device to improve the operating speed in the normal mode.

SUMMARY OF THE INVENTION

The present invention has as an object the implementation of a semiconductor memory device which provides improved operating speed regardless of the operating mode.

The first aspect of a semiconductor memory device according to the present invention is a semiconductor memory device having a mode in which address positions are accessed by means of instructions from an external address signal, and at least one mode in which, rather than directly accessing the address position indicated by the above-noted external address signal, an address position internally generated in accordance with prescribed data is accessed, this semiconductor memory device also having a normal memory cell array, redundancy memory cells for exchanging with defective cells in the normal memory cell array in the prescribed units, a redundancy determining circuit which determines whether or not, of a number of modes, the mode is one in which the actually accessed address position is an exchanged position, and which, in the case of access of an exchanged memory cell, performs control so that the exchanged memory cell of the redundancy memory cell array is accessed, and which in other cases performs control so that above-noted normal memory cell array is accessed, a mode determining circuit which determines the mode, and at least one internal address generating circuit which automatically generates internally a signal which calls for an address position to be accessed in accordance with prescribed data. At least part of the mode determination made by the mode determining circuit and the determination of whether or not the address position to be accessed is an exchanged memory cell is performed in parallel.

In a prior art semiconductor memory device, the redundancy determination was performed after the operating mode determination, there being no processing performed at all with regard to the address while the operating mode determination is being performed, the address signal being essentially left idle. On the other hand, during the redundancy determination, the results of the determination of the operating mode are no longer needed, and are also left idle, these resulting in an overall operational waste. Therefore, if this waste can be eliminated, it is possible to improve the operating speed. In the first aspect of a semiconductor memory device according to the present invention, by causing the operating mode determination and the redundancy determination to be performed in parallel, the amount of time each of the signals remains idle is reduced, thus eliminating waste and achieving a high speed in the semiconductor memory device.

However, when performing the operating mode determination and the redundancy determination in parallel, because the operating mode determination is not completed, it is not known whether the address actually accessed is from an external address signal or an internally generated address. For that reason, the second aspect of the present invention has, in addition to the first aspect of the present invention, at least one internal address generating circuit which automatically and internally generates a signal which indicates an address position to be accessed, in accordance with prescribed data, the redundancy determining circuit having an external address redundancy determining circuit which performs a determination of whether the address position specified by an external address signal is an exchanged memory cell and at least one internal address redundancy determining circuit which performs a determination of whether the address position specified by the internal address signal which is generated by the at least one internal address generating circuit is an exchanged memory cell, wherein when a determination is made that the address position specified by the external address signal is an exchanged memory cell, at least one parallel determination is performed as to whether the address position specified by the internal address signal generated by the internal address generating circuit is an exchanged memory cell.

The third aspect of the present invention has, in addition to the first aspect of the present invention, at least one internal address generating circuit which automatically and internally generates a signal which specifies an address position to be accessed, in accordance with prescribed data, the circuit which performs a determination of whether an actually accessed address position is an exchanged memory cell being shared in a plurality of modes, the determination of whether the actually accessed address position is an exchanged memory cell being performed sequentially in the various modes.

When there is a plurality of modes in which an address is internally generated, it is necessary for each to have its own redundancy determining circuit. However, in combination with a sequential redundancy determining method to be described later, it is not always necessary to have a redundancy determining circuit for all addresses which are internally generated corresponding to each mode. In the third aspect of the present invention, a redundancy determining circuit which performs a determination of the external address and the determination of the internally generated address is shared. Because one and the same redundancy determining circuit is used to perform a determination for two addresses, the redundancy determination is performed in two operations, with a time skew therebetween.

With regard to an externally input address, although it is not possible to predict beforehand what type of information is given, with regard to addresses which are internally generated in accordance with a special mode, because it is possible to obtain information beforehand, by performing the redundancy determination for this on a previous cycle, it is possible to do this simultaneously with the mode determination in the case of redundancy determination for an externally input address. Because the redundancy determination for an externally input address is performed simultaneously with the redundancy determination for an address generated internally in the previous cycle, it is possible to share a single circuit. In the fourth aspect of the present invention, before the next access cycle is started, the internal address generating circuit of the third aspect of the present invention generates a signal which specifies an address position to be accessed next, a circuit which is shared between a plurality of modes performing, simultaneously with the mode determination by the mode determining circuit, a determination of whether the address position which is specified by the externally input address signal is an exchanged memory cell, and a determination being made before the above-noted access cycle of whether the address position specified by one of the internally generated address signals generated by the internal address signal generating circuit is an exchanged memory cell.

With regard to internally generated addresses, the redundancy determining circuit which is illustrated can be used to complete the redundancy determination on the previous cycle. On the cycle, the redundancy determining circuit performs a redundancy determination of an externally input address, this being done in parallel with the mode determination. Therefore, only one redundancy determining circuit is needed, the time required for the determination being the longer of the time for mode determination and the time for the redundancy determination. In this case, even if the redundancy determining time is longer than the mode determining time, the time required for completion of the determining operations is only the sum of the redundancy determining time and the address exchanging time. Although, off course, time is required for incrementing the internally generated address and for performing a redundancy determination on the incremented address, this is not related to the time for generating an address for the purpose of cell selection, so that it does not influence access time.

BRIEF DESCRIPTION OF THE DRAWINGS

The present invention will be more clearly understood from the description as set forth below, with reference to the accompanying drawings, wherein:

FIG. 5 is a drawing which illustrates the principle of the third aspect of the present invention;

FIG. 6 is a drawing which illustrates the principle of the fourth aspect of the present invention;

DESCRIPTION OF THE PREFERRED EMBODIMENT

Before proceeding to a detailed description of the preferred embodiments of the present invention, a conventional semiconductor memory device will be described below, to allow a clearer understanding of the differences between the present invention and the prior art.

Figure 1:
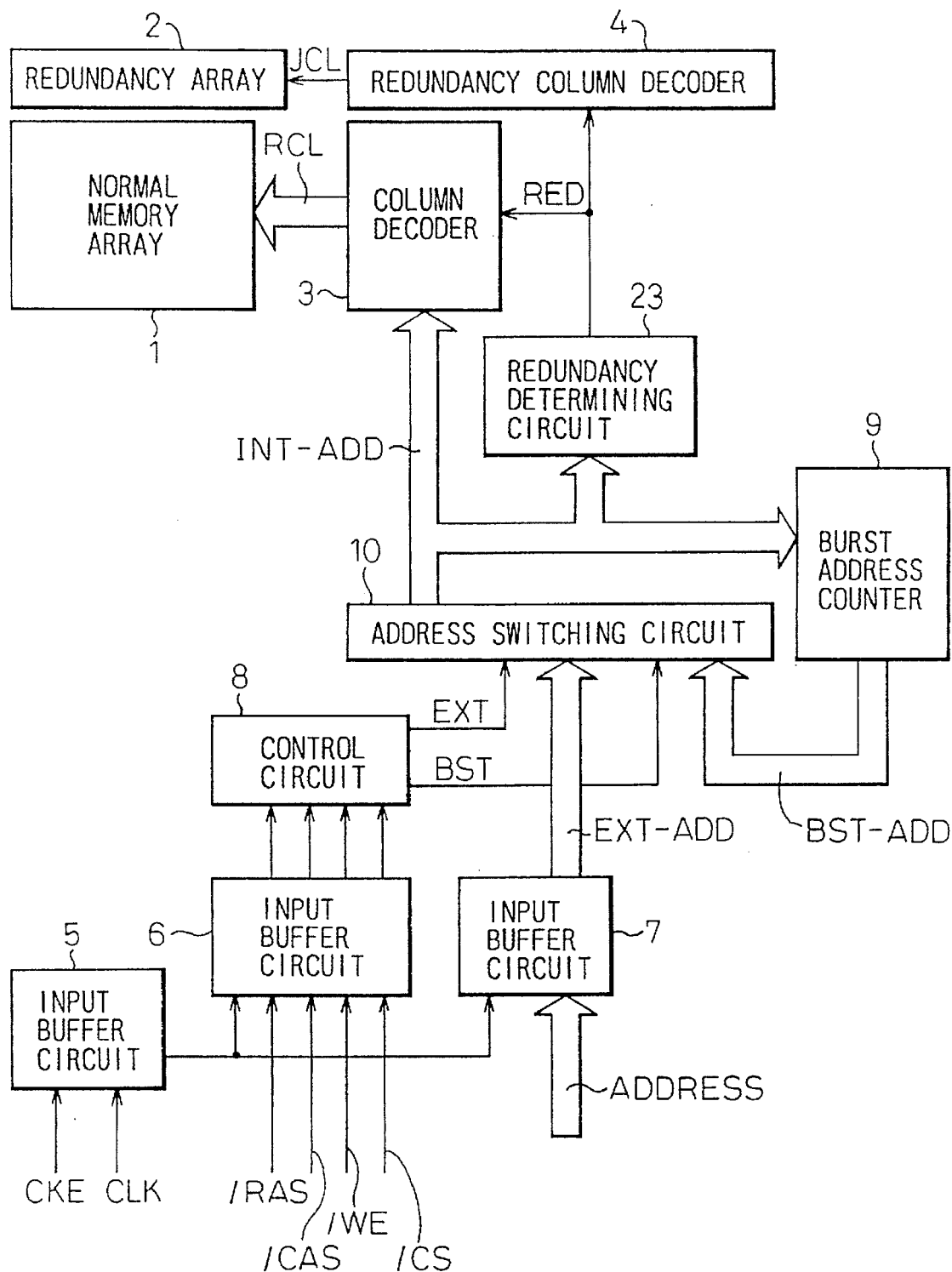
FIG. 1 is a block diagram which shows the configuration of a prior art synchronous DRAM having column address redundancy.

FIG. 1 is a drawing which shows the configuration of a prior art synchronous DRAM with column address redundancy, and having a burst read mode as noted above. In the drawings which follow, elements having the same function are assigned the same reference numerals, and duplicated descriptions of such elements are omitted.

In FIG. 1, the reference numeral 1 denotes a normal memory cell array, 2 is a redundancy cell array which replaces a column line which includes a defective cell in the case in which the normal memory cell array 1 has a defective cell. 3 is a column decoder, 4 is a redundancy column decoder which selects a redundancy cell array, 5 is an input buffer circuit for a clock signal which is externally input, 6 is a control signal input buffer, 7 is an address signal input buffer, 8 is a control circuit, 9 is a burst address counter which generates a number of bits of continuous addresses from an address specified by an external address in the burst read mode, 10 is an address switching circuit which switches between an externally input address and an address which is generated by the burst address counter 9, and 23 is a redundancy determining circuit which determines whether an address output by the address switching circuit 10 is an address to be replaced by the redundancy cell array 2. Other row decoders and the like are also included, but are omitted from this description.

Figure 2:
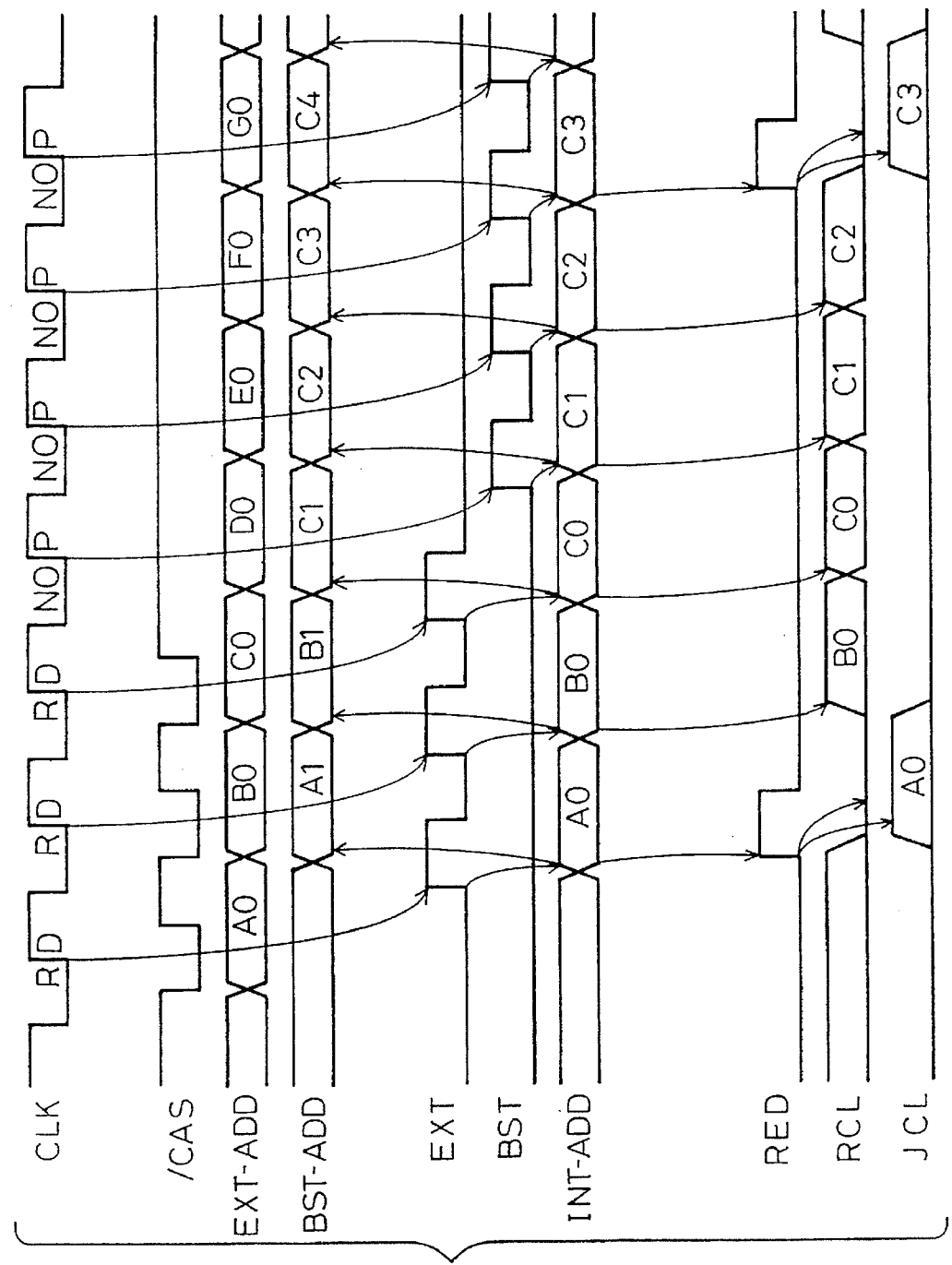
FIG. 2 is a timing diagram which shows the operation of the prior art which is shown in FIG. 1.

FIG. 2 is a timing diagram which shows the normal read mode and burst read mode operation of the synchronous DRAM having a burst read mode, which is shown in FIG. 1.

As shown in FIG. 2, the enabling of the normal read mode or the burst read mode is done in accordance with whether /CAS is low or high at the time of the rising edge of the clock signal CLK. Therefore, the control circuit 8 has a function which tests the states of CLK and /CAS and determines the mode. In the case in which the burst read mode is enabled in this manner, the burst address counter 9 generates addresses sequentially, following after the externally input address which was previously input. In FIG. 2, when in the external addresses A0, B0, C0 are input, /CAS is low at the time of the rising edge of the clock signal CLK, so that the normal read mode is sensed, the address switching circuit 10 outputting A0, B0, C0 to the internal bus INT-ADD on the next cycle. At this time the burst address counter 9, in response to the A0, B0, C0 output to the internal bus, generates the next addresses A1, B1, and C1, and outputs these to the burst address bus BST-ADD. However, since the normal mode is sensed, the address switching circuit 10 outputs the address of the external address bus EXT-ADD.

After the external data C0 is input, since /CAS is fixed at the high level, at the rising edge of CLK on the next cycle, the burst read mode is sensed. At this cycle the burst address counter 9 generates the address C1 which follows C0, and outputs this to the burst address bus, the address switching circuit 10 performing switching so that the burst address bus address, that is, C1, is output to the internal bus. Therefore, the externally input address D0 at this time is not output to the internal bus.

The redundancy determining circuit 23 makes a determination of whether the address output by the address switching circuit 10 is an exchanged address. Therefore, in the original normal read mode, the externally input addresses A0, B0, C0 are sensed, after which in the burst read mode the addresses C1, C2, C3, and so on, which follow after C0, are sensed. Assume now that the column line corresponding to the addresses A0 and C3 is defective, this being exchanged with a redundancy cell. When the addresses A0 and C3 are input to the internal bus, the redundancy determining circuit 23 senses that this is an exchanged address, the redundancy column decoder 4 then outputting a selection signal to the redundancy column line JCL which replaces the addresses A0 and C3. When this is done, a selection signal is not output to the normal column line RCL. In the cases of addresses other than A0 and C3, the selection signal is output to the normal column line RCL, and no selection signal is output to the redundancy column line JCL.

Figure 3:
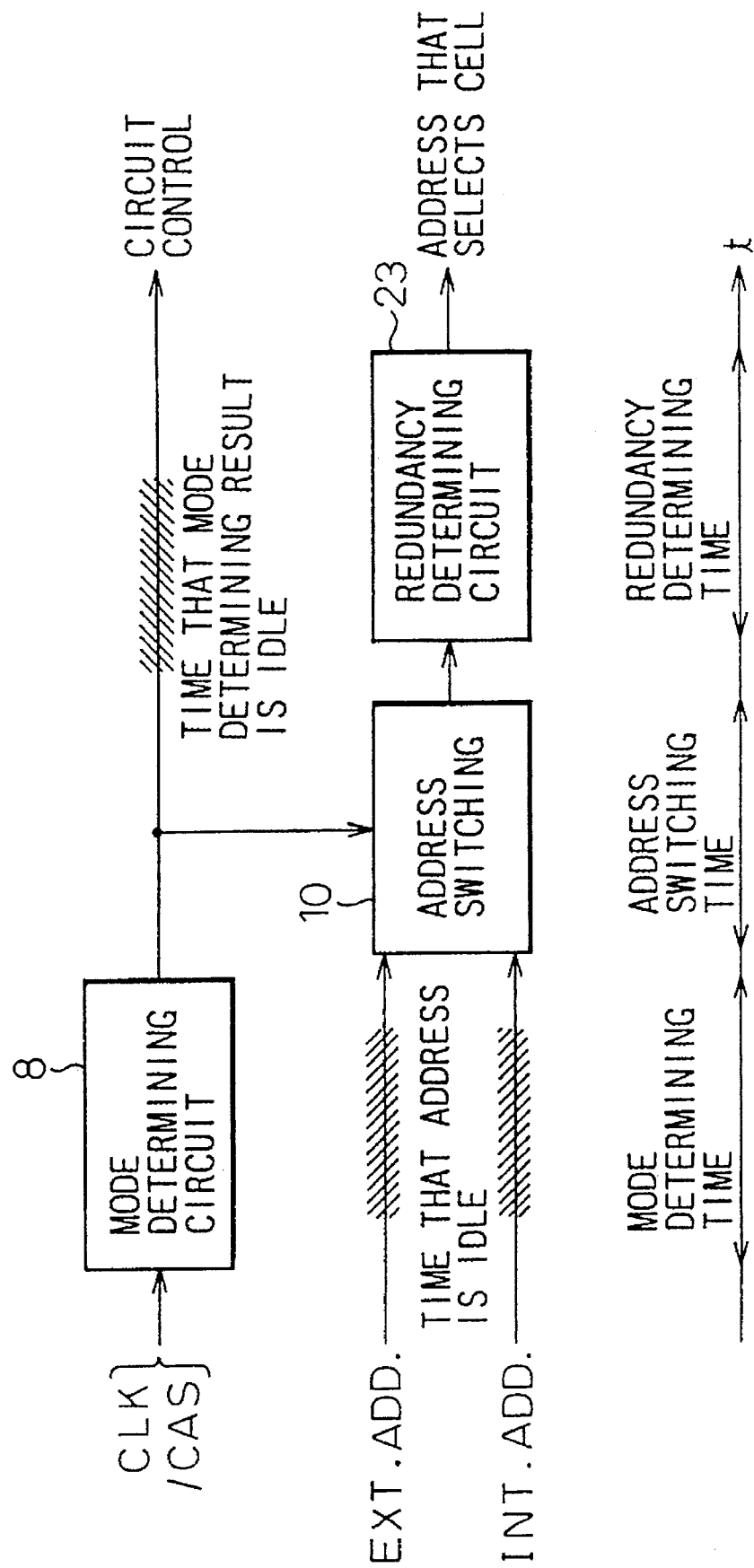
FIG. 3 is a drawing which shows the operating principle of the prior art.

The above is a description of the operation in a synchronous DRAM having a burst read mode, the related operating principle being illustrated in FIG. 3.

Specifically, the operation is in three steps. First the mode switching circuit 8 determines the mode from control signals such as CLK and /CAS, after which, in response to the mode, the address switching circuit 10 selects either the external address or the internally generated address, the redundancy determining circuit 23 making a determination as to whether the address selected by the address switching circuit 10 is an exchanged address.

The above is also true in the case of a normal read mode and CBR refresh mode in a DRAM. In the normal read mode, a memory cell specified by an externally input address is accessed, whereas in the CBR refresh mode, the next address to be refreshed is internally generated, access being performed based on that address. Therefore, after the determination of the mode, the actual address used to select the memory cell is determined by switching between the externally input address and internally generated address, and determining whether the thus selected address is an exchanged address. Thus, to perform the actual access, the time required is the sum of the mode determining time, the address switching time, and the redundancy determining time. In a semiconductor memory device according to the present invention, this time is shortened to improve the operating speed.

Next, the principle of present invention will be described.

Figure 4A:
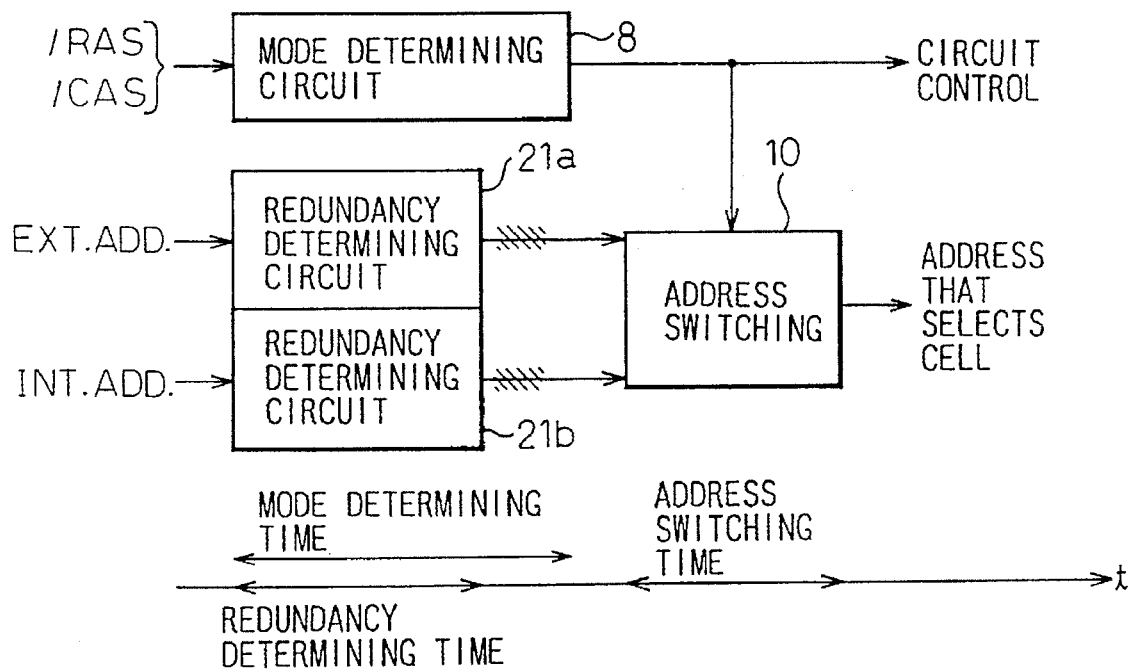
FIG. 4A and FIG. 4B are drawings which illustrate the principle of the second aspect of the present invention.
Figure 4B:
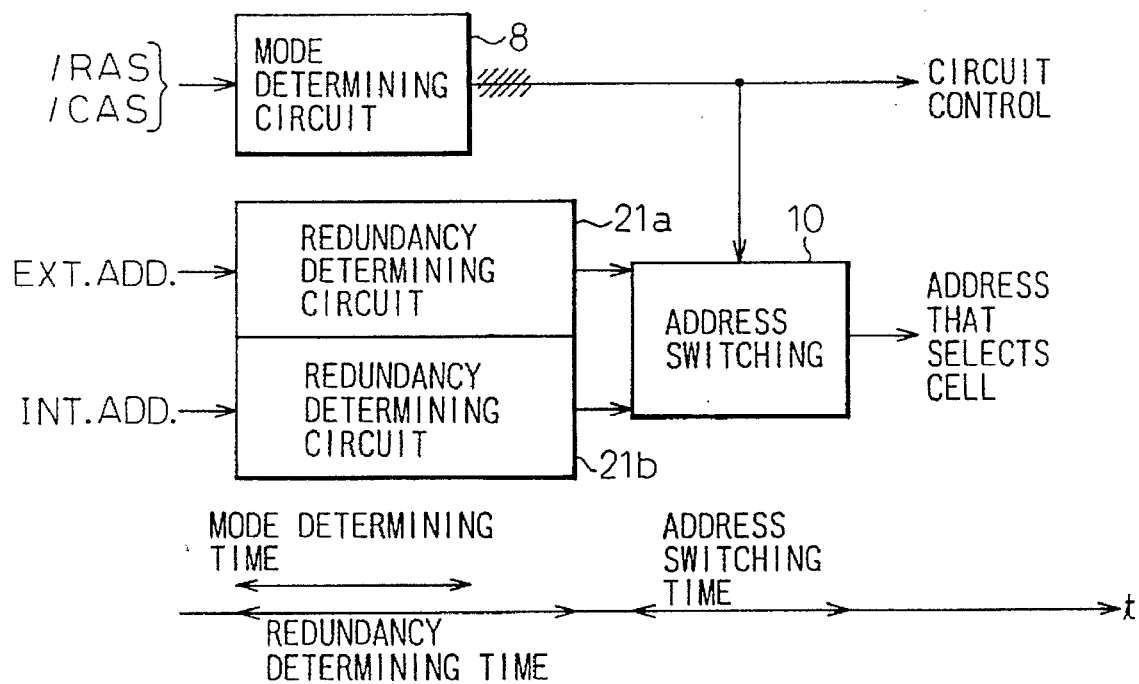

FIG. 4A and FIG. 4B show the principle of the second aspect of the present invention.

In a semiconductor memory device according to the present invention, by performing the operating mode determination and the redundancy determination in parallel, the time that each signal remains idle is reduced, thereby reducing wasted time, and achieving a semiconductor memory device with improved speed. In performing operating mode determination and redundancy determination in parallel, since the operating mode determination is not completed, it is not known whether the address actually used in the accessing of the memory is an externally input address or an internally generated address. Because the operating mode determination and redundancy determination are performed in parallel, as shown in FIG. 4A and FIG. 4B, in a semiconductor memory device of the second aspect of the present invention, the redundancy determining circuit is formed by an external address redundancy determining circuit, which performs a determination of whether the address position specified by an external address signal is an exchanged memory cell, and an internal redundancy determining circuit, which performs a determination of whether the address position specified by the address signal generated by at least one internal address generating circuits is an exchanged memory cell, thereby causing the parallel operation of a plurality of redundancy circuits.

FIG. 4A shows the case in which the redundancy determination is completed in a shorter time than the mode determination, while FIG. 4B shows the case in which the mode determination required a longer time for completion than the redundancy determination. In this manner, the time required for the determination operation is established by the longer of the operating mode determination and the redundancy determination, so that the overall determination time is shortened by the shorter of two determination times.

In the case in which there is a plurality of modes in which addresses are generated, it is necessary to have a redundancy determining circuit for each of these modes. However, in combination with a sequential redundancy determining method to be described later, it is not always necessary to have a redundancy determining circuit for all addresses which are internally generated corresponding to each mode.

However, in the second aspect of the present invention as illustrated in FIG. 4A and FIG. 4B, it is necessary to have a plurality of position storing circuits which indicate an address exactly the same as the address of an exchanged cell. Although these position storing circuits are usually implemented using fusible ROMs, this is accompanied by the problem of an increased chip size, due to the large surface area of a fusible ROM.

FIG. 5 shows the principle of the third aspect of the present invention, which solves the above-noted problem.

In the third aspect of the present invention, the redundancy determining circuit 22 is shared by the external address determination and the internally generated address determination. Because a single redundancy determining circuit is used for the determinations for two addresses, the determinations are performed in two passes, with a time skew therebetween. For this reason, as long as the time for one is less than the times required for mode determination, the time required for completion of the determination operation is limited to two time the redundancy determining time. In the case in which the redundancy determining time is extremely short in comparison with the mode determination time, this method is sufficient. On the other hand, however, if the redundancy determining time is longer than the mode determination time, this method requires more time than the conventional method, making unsuitable the application of this aspect of the present invention.

Japanese Unexamined Patent Application Publication No. 2-83899 noted above discloses a semiconductor memory device in which the redundancy determination for an internally generated address is performed on the previous cycle, this idea being applicable as well to the present invention, and corresponding to the fourth aspect of the present invention.

With regard to an address which is externally input, although it is not possible to predict beforehand what type of information is given, with regard to addresses which are internally generated in accordance with a special mode, because it is possible to obtain information beforehand, by performing the redundancy determination for this on a previous cycle, it is possible to do this simultaneously with the mode determination in the case of redundancy determination for an externally input address. Because the redundancy determination for an externally input address is performed simultaneously with the redundancy determination for an address generated internally in the previous cycle, it is possible to share a single circuit.

FIG. 6 shows the principle of the fourth aspect of the present invention.

The redundancy determination with regard to an internally generated address is completed by the redundancy determining circuit 22 at the cycle before the cycle shown in FIG. 6. At this cycle, the redundancy determination of an externally input address is performed in parallel with the mode determination. Therefore, only a single redundancy determining circuit is required, the time required for the determination being the longer of the mode determination time and the redundancy determining time. In this case, even if the redundancy determining time is longer than the mode determining time, the time required for completion of the determining operations is only the sum of the redundancy determining time and the address exchanging time. Although, of course, time is required for incrementing the internally generated address and for performing a redundancy determination on the incremented address. However, as this is not related to the time for generating an address for the purpose of cell selection, it does not influence access time.

Next, an additional description of the fourth aspect of the present invention will be provided with relation to the example of the CBR refresh mode in a DRAM.

In the normal operation of a DRAM, the row address is read in on the falling edge of /RAS, after which the column address is read in on the falling edge of /CAS. In the case in which /CAS has already fallen before the falling edge of /RAS, a determination is made as to whether the mode is the normal mode or the CBR refresh mode. In the case of the CBR refresh mode, rather than reading the external address into the DRAM, the address of a refresh address counter is used. The refresh operation is performed by accessing all row addresses during a given time period, and because there is no predetermined sequence in which this accessing is performed, it is sufficient to simply increment the row address through a number of bits representing the number of pins. Therefore, after power is applied to the DRAM, if the first mode sensed is the CBR refresh mode, any address in the address counter at that point is refreshed, the counter being incrementable during that same cycle to obtain the next refresh address. Thereafter, each time the mode is sensed to be the CBR refresh mode, by repeating the operations of refreshing the address in the refresh address counter at that point and obtaining the next refresh address, it is possible to always know on the previous cycle what internally generated address will be used next.

If the internally generated address to be used on the next cycle is always known on the previous cycle, it is also possible to perform a redundancy determination on the internally generated address by the immediately previous cycle.

while the foregoing was a description of the burst read mode and the CBR refresh mode of a DRAM, this can be applied as well to other modes in which an address to be accessed is internally generated. This can even be applied if there is a plurality of such modes, in which case, as in the case of the above-noted second aspect of the present invention, various forms are possible, such as in combination with the fourth aspect of the present invention. For example, in the case in which both the burst read mode and the CBR refresh mode are provided, two redundancy determining circuits are provided, a redundancy determination being performed in parallel on the previous cycle for both the burst address and the refresh address, the external address redundancy determination being performed in parallel with the mode determination, using one of the redundancy determining circuits.

Figure 7:
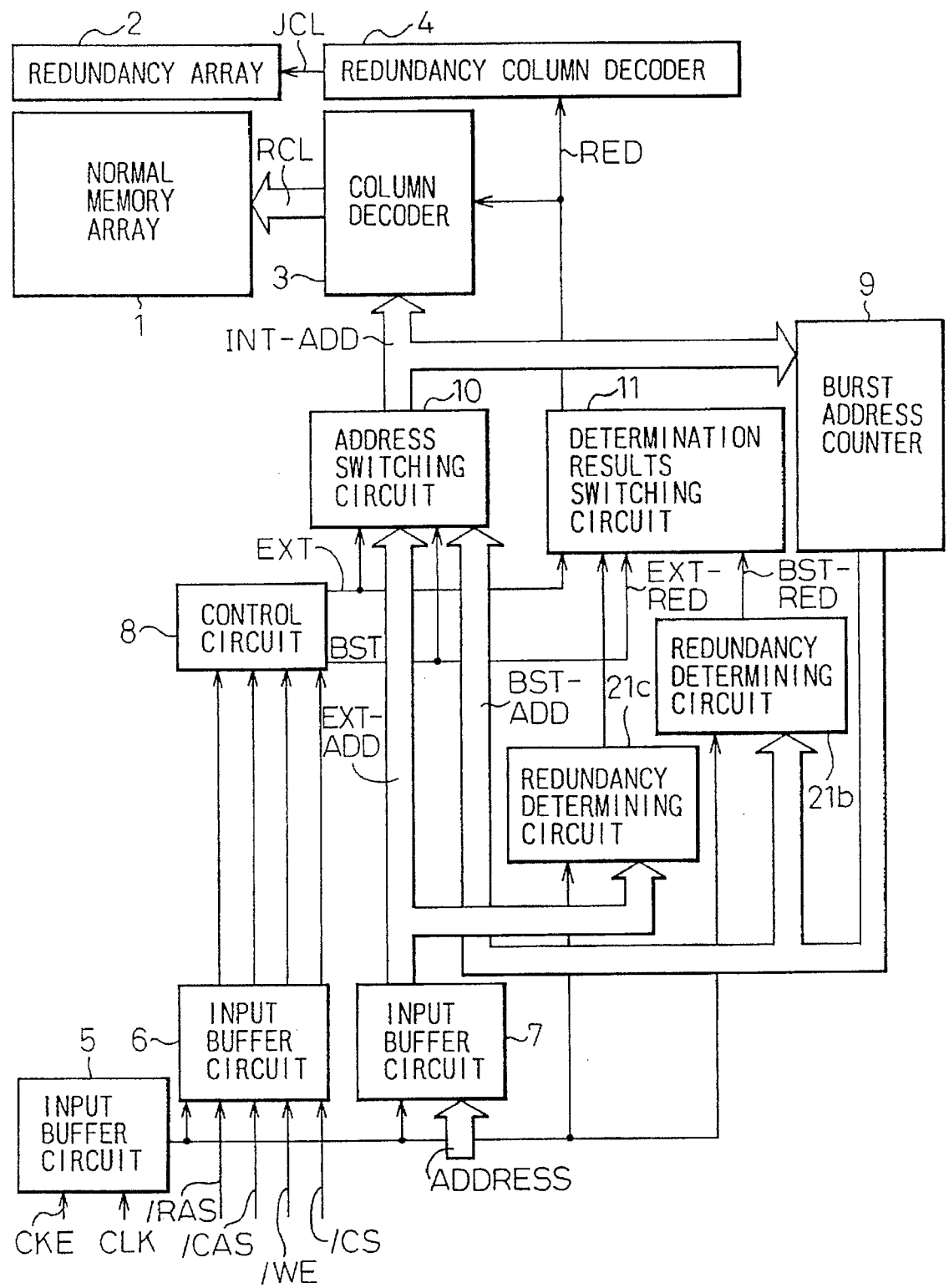
FIG. 7 is a drawing which shows the configuration of the first embodiment of the present invention.
Figure 8:
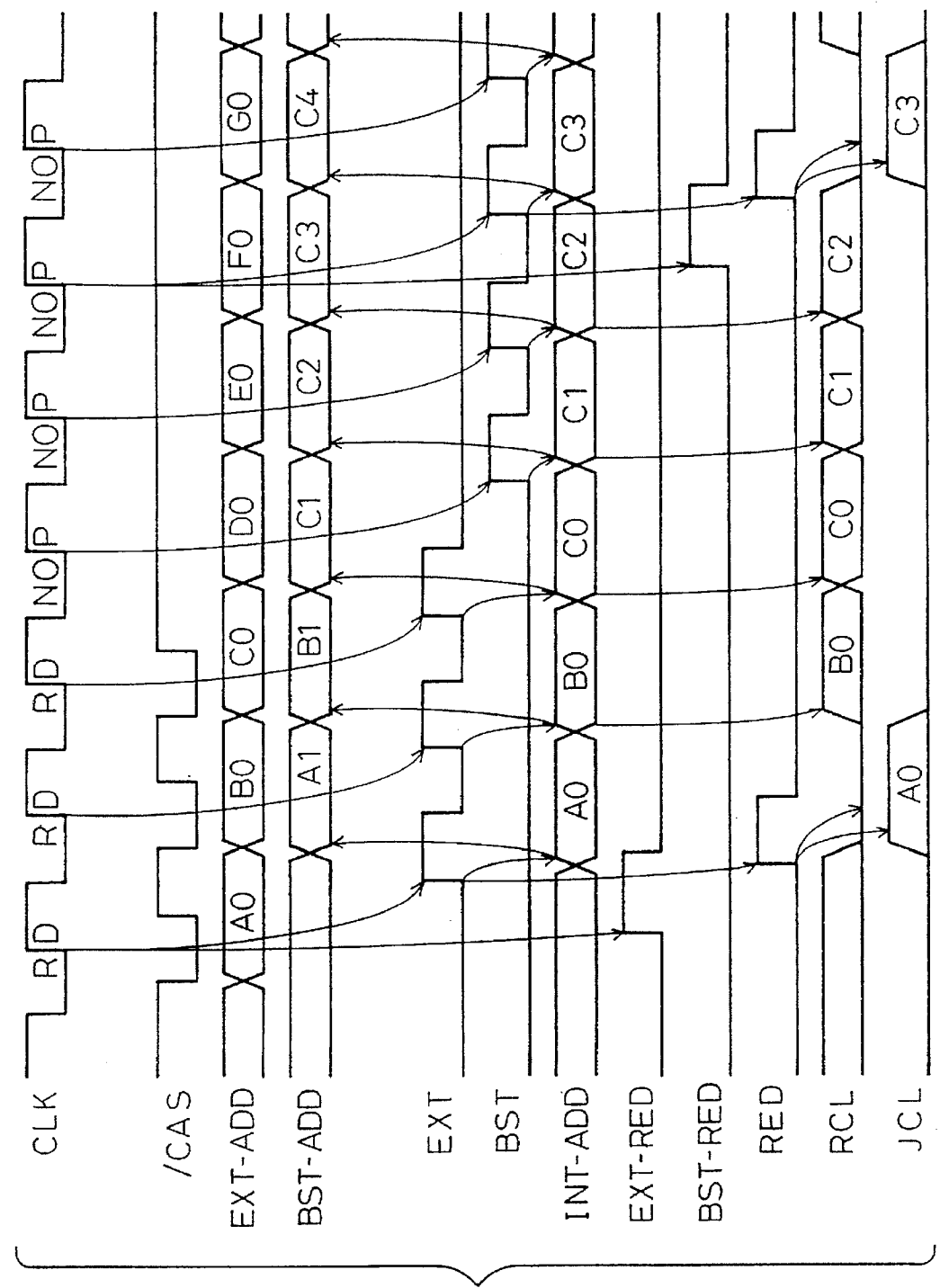
FIG. 8 is a timing diagram of the first embodiment of the present invention.

FIG. 7 shows the configuration of a synchronous DRAM according to the first embodiment of the present invention, which has column address redundancy. FIG. 8 is a timing diagram showing the operation of this first embodiment. This embodiment corresponds to the second aspect of the present invention described above.

As is clear from a comparison with FIG. 1, whereas in the configuration of the prior art the redundancy determining circuit 23 is provided on the internal bus, in the first embodiment of the present invention, two redundancy determining circuits 21a and 21b are provided in parallel to the address switching circuit 10, a determination results switching circuit 11 which switches the results of the redundancy determining circuits 21a and 21b which are output to a redundancy column decoder 4 being also provided.

In this embodiment, the mode determination by the control circuit 8, the redundancy determination of the externally input address by the redundancy determining circuits 21a and 21b, and the burst address redundancy determination are performed simultaneously. In accordance with the mode determination results which are output by the control circuit 8, the outputs of the redundancy determining circuits 21a and 21b are selected by the determination results switching circuit 11. That is, if the normal mode is sensed, the redundancy determination results for an externally input address, which are output by the redundancy determining circuit 21a, are output to the column decoder 3 and the redundant column decoder. In response to this if, for example as shown in FIG. 8, address A0 is accessed, since this address is an exchanged address the selection signal from the redundancy column decoder 4 is output to the redundancy memory cell array 2. If the burst read mode is sensed, the redundancy determination results for the burst address, which are output by the redundancy determining circuit 21b are output. For example, in the case of the burst addresses C1 and C2, since the results of the determination are that these are not exchanged addresses, the selection signal is output from the column decoder 3, but in the case of the burst address C3, since this is an exchanged address, the selection signal is output from the redundancy column decoder 4.

Figure 10:
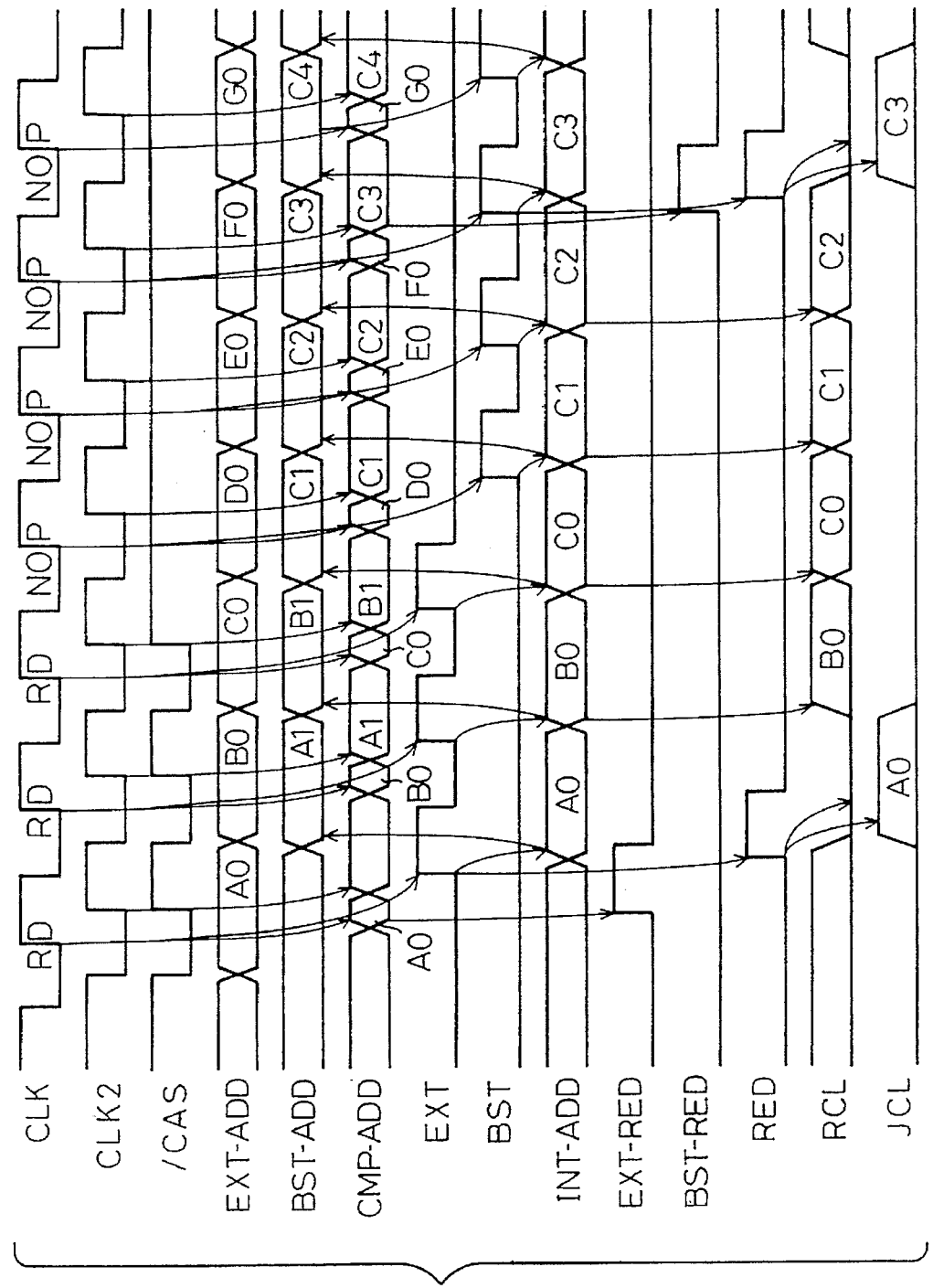
FIG. 10 is a timing chart of the second embodiment of the present invention.

FIG. 8 shows the configuration of a synchronous DRAM according to the second embodiment of the present invention, which has column address redundancy. FIG. 10 is a timing diagram showing the operation of this second embodiment. This embodiment corresponds to the third aspect of the present invention described above.

As is clear from a comparison with FIG. 1, whereas in the configuration of the prior art the redundancy determining circuit 23 is provided on the internal bus, the second embodiment of the present invention differs from the prior art in that the redundancy determining circuit 22 is provided in parallel to the address switching circuit 10, in addition to the provision of an input switching circuit 12 which switches the address that is input to the redundancy determining circuit 22 between an externally input address and a burst address, a determination results holding circuit 13 which holds the results determined by the redundancy determining circuit 22, and a determination results switching circuit 11 which switches the results of the redundancy determining circuit 22 which are output to the column decoder 3 and the redundancy column decoder 4. A delay circuit 14 is a circuit which generates a clock signal CLK2 for the purpose of starting the second redundancy determination made at the redundancy determining circuit 22.

In this embodiment, the redundancy determinations by the redundancy determining circuit 22 of the externally input address and burst address are performed in sequence. Therefore, the input switching circuit 12 switches the address which is input to the redundancy determining circuit 22 between these two addresses. The previous results from the redundancy determination must be held until the completion of the mode determination, these results being held by the determination results holding circuit 13. At the point at which the mode determination by the control circuit 8 and the redundancy determination of the externally input address and burst address are completed, in response to the mode which is sensed by the control circuit 8, the externally input address and burst address redundancy determination results are selected by the determination results switching circuit 11.

Figure 11:
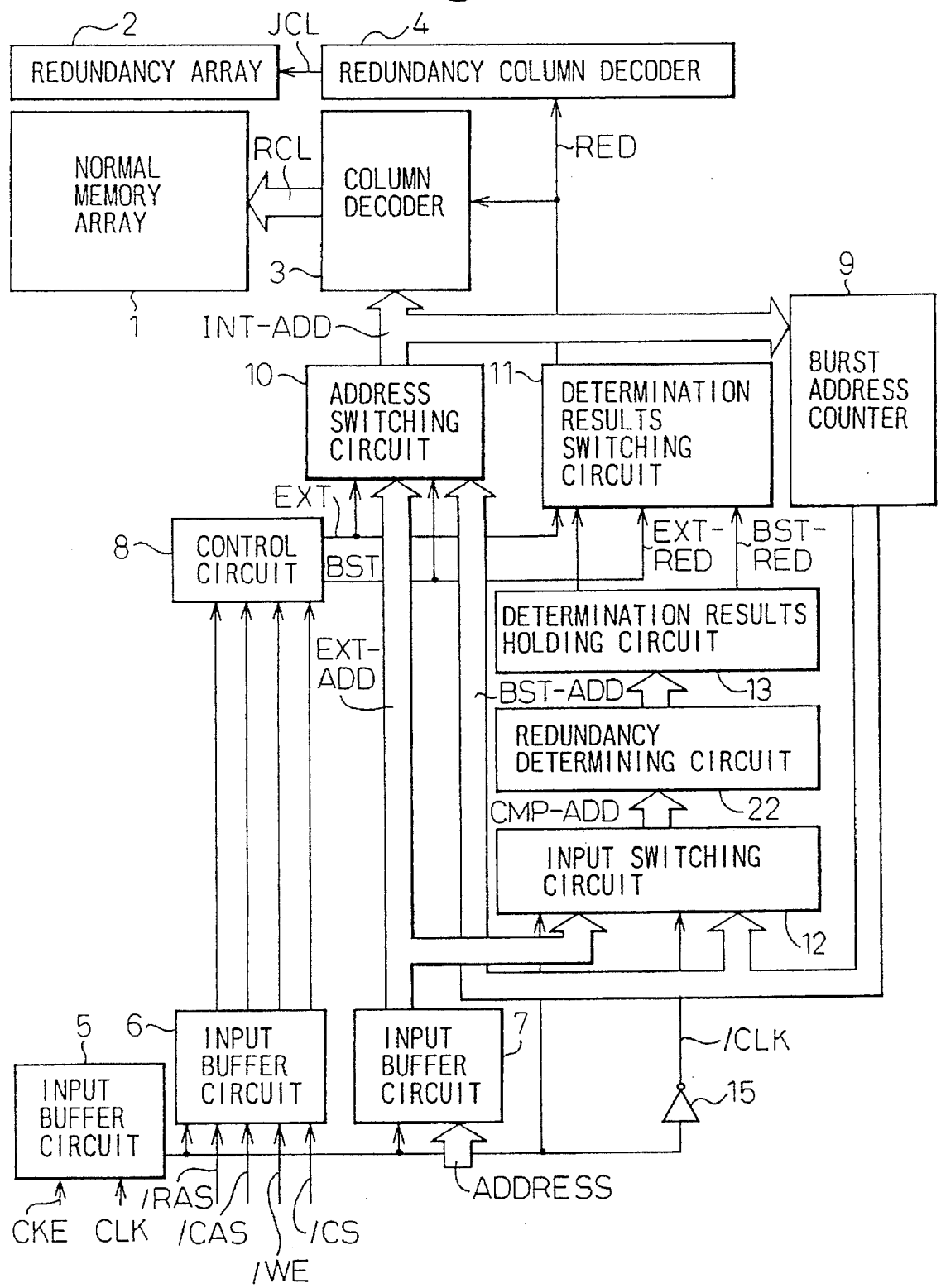
FIG. 11 is a drawing which shows the configuration of the third embodiment of the present invention.
Figure 12:
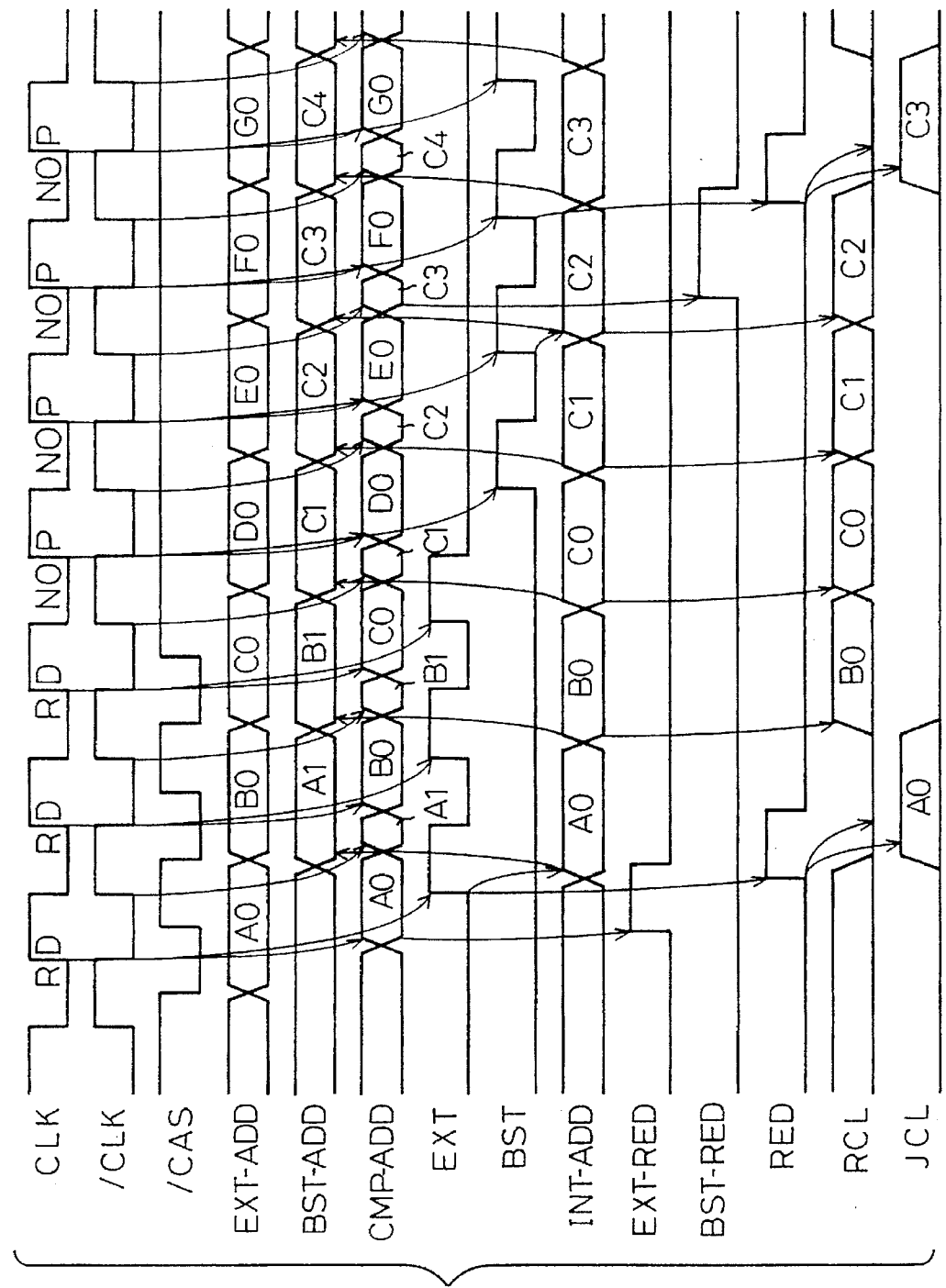
FIG. 12 is a timing diagram of the third embodiment of the present invention.

FIG. 11 shows the configuration of a synchronous DRAM according to the third embodiment of the present invention, which has column address redundancy. FIG. 12 is a timing diagram showing the operation of this third embodiment. This embodiment corresponds to the fourth aspect of the present invention described above.

Figure 9:
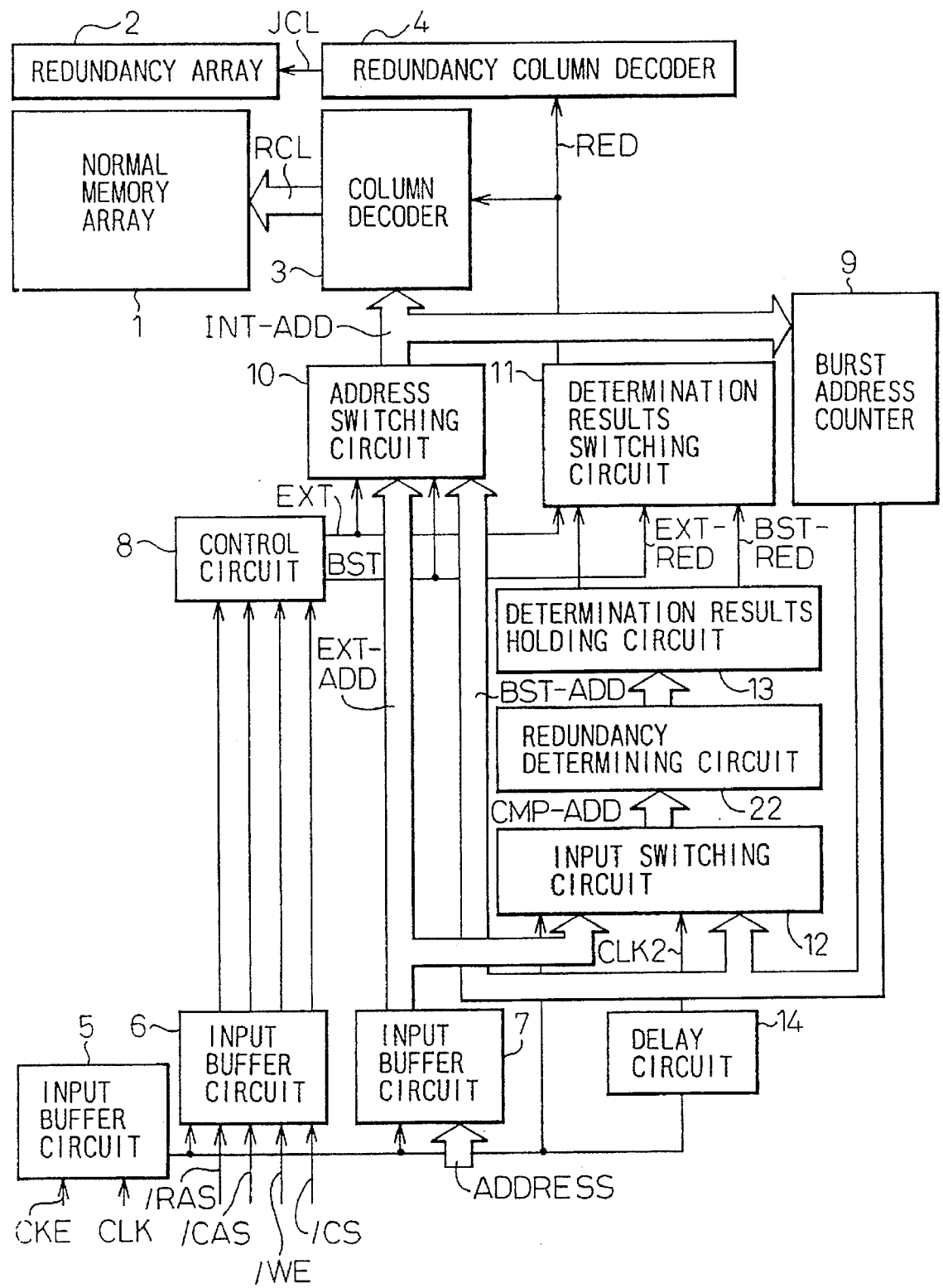
FIG. 9 is a drawing which shows the configuration of the second embodiment of the present invention.

As is clear from a comparison with FIG. 9, the configuration of this embodiment is approximately the same as the configuration of the second embodiment, it differing however in that in place of the delay circuit 14, an inverter gate 15 is provided which inverts the clock signal CLK to obtain /CLK.

Figure 13:
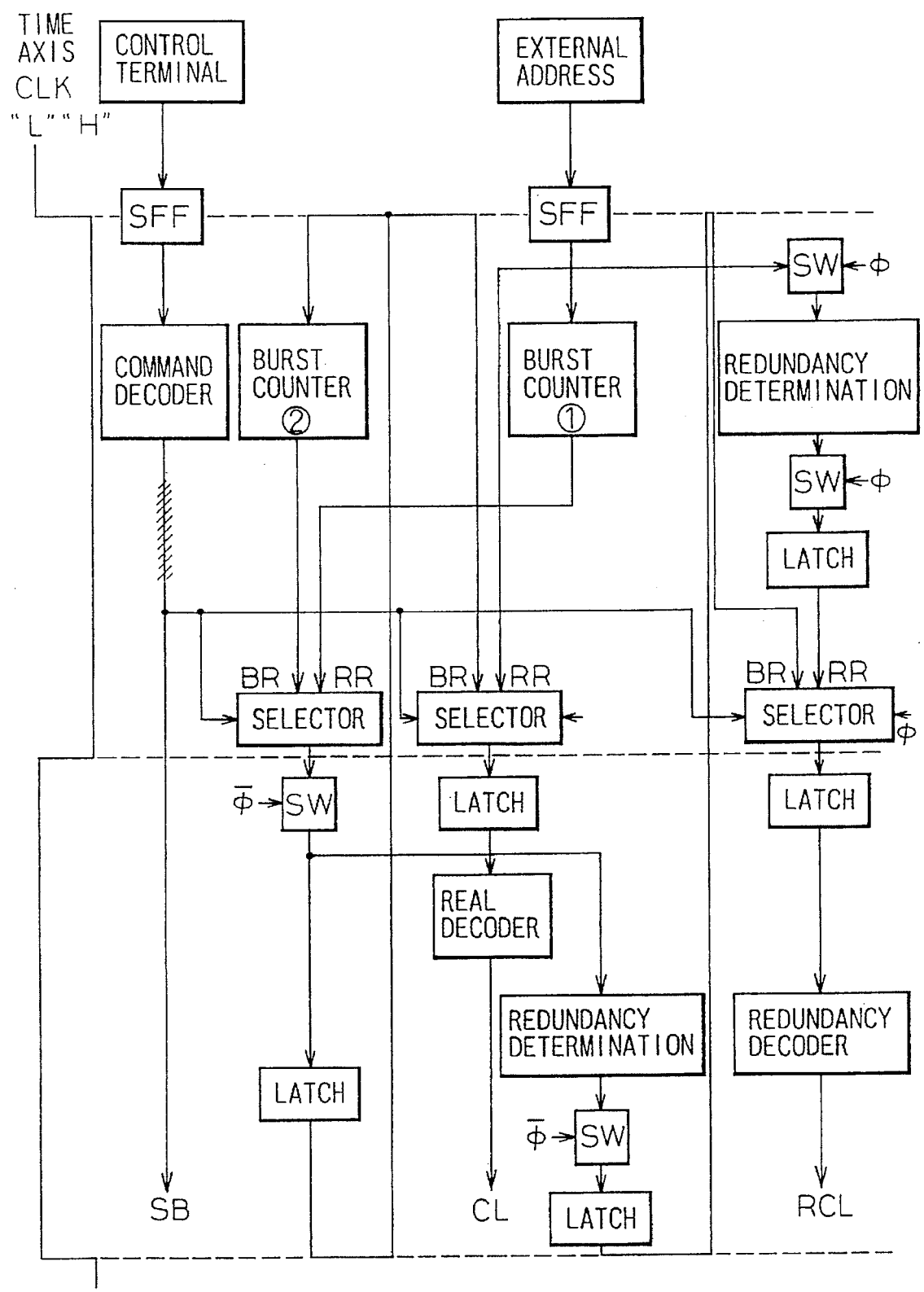
FIG. 13 is a drawing which shows the operation of various parts of, and data flow in, the third embodiment of the present invention.

In this embodiment, the burst address redundancy determination is performed on the previous cycle. FIG. 13 shows the operational flow of various parts of the third embodiment of the present invention, the vertical direction representing the time axis. Tile third embodiment of the present invention will be described in detail below, with reference to FIG. 13.

As shown in FIG. 13, simultaneous with the rising edge of the clock CLK the operating mode determination and external address redundancy determination are started by the command decoder of the control circuit 8. Also simultaneously with this, for the case in which the next cycle is the burst read mode, the burst address of the externally input address is generated at the burst address counter 9. In terms of timings, the latching of the normal redundancy determination occurs the latest. When the random read mode is selected by means of the command decoder, the external address is transferred to the column decoder 3 by means of the address switching circuit 10, the external address redundancy determination results being transferred to the redundancy column decoder 4 and the current external address burst address being transferred to the burst address latch circuit of the burst address counter 9, by the determination results switching circuit 11. In the latter half of the cycle, when the clock falls a redundancy determination is performed on the current external address burst address which was transferred to the burst address latch circuit, and on the next cycle the redundancy determination of a burst address which could possibly be the address is completed, which selects a cell. When this occurs, the time for this redundancy determination is not related to the time to transfer the address to the column decoder, so that access of the memory cell is not prevented.

After the next cycle is entered, when the clock rises, similar to the previous cycle, the operating mode determination and external address redundancy determination by the command decoder, and the generation of the burst address for the external address for the case in which the next cycle is the burst read mode are performed. In anticipation that the current cycle is determined to be the burst read mode and also that the next cycle continues to be the burst read mode, it is necessary to generate the burst address for the previously generated burst address (because the previous cycle was the random read mode, this being the second address after the external address at that point, which is the next address after the address which was latched into the burst address latch circuit in the latter half of the previous cycle).

When the burst read mode is selected by the command decoder, by means of the various selectors, the burst address (next address after the external address of the previous cycle) which was latched into the burst address latch circuit in the latter half of the previous cycle is transferred to the column decoder, and the burst address of the burst address which was generated anew at the current cycle is transferred to the burst address latch circuit. Going into the latter half of the cycle, when the clock falls, a redundancy determination is performed of the burst address of the burst address which had been transferred to the burst address latch circuit, and on the next cycle the redundancy determination is completed of a burst address of a burst address which could possibly be the address which selects a cell. When this occurs, the time for this redundancy determination is not related to the time to transfer the address to the column decoder, so that access of the memory cell is not prevented.

Thereafter, the above operations are repeated each time the operating mode is randomly switched.

While in the above description of embodiments of the present invention the example of column redundancy was presented, the present invention is not limited to column redundancy, and can be applied as well to row redundancy.

As described above, according to the present invention, it is not only possible to improve the operating speed of a semiconductor memory device which has a plurality of operating modes, but also to implement this without an increase in the surface area of the semiconductor chip.

What is claimed is:

1. A semiconductor device, comprising:

a normal memory cell army;

a redundancy memory cell for exchanging with defective cells in said normal memory cell army in the prescribed exchange units;

a mode determining circuit which determines a kind of modes based on an externally applied signal, said modes having a mode in which an address position specified by said external address signal is accessed and at least one mode in which an address position specified by an internal address signal generated internally in accordance with prescribed data;

an address switching circuit which switches the actually accessed address position between said address position specified by an external address signal and said address position specified by said internal address signal according to a determination result of said mode determining circuit; and a redundancy determining circuit which determines whether or not the actually accessed position is an exchanged position, and which, in the case of access of an exchanged memory cell, performs control so that the exchanged memory cell of the redundancy memory cell array is accessed, and which in other cases performs control so that said normal memory cell array is accessed, wherein at least part of said mode determination made by said mode determining circuit and the determination made by said redundancy determining circuit are performed in parallel.

2. A semiconductor memory device according to claim 1, further comprising:

at least one internal address generating circuit which automatically generates said internal address signal, wherein said redundancy determining circuit which has an external address redundancy determining circuit which determines whether or not said address position specified by said external address signal is an exchanged memory and at least one internal address redundancy determining circuit which determines whether or not said address position specified by said internal address signal is an exchanged memory cell; and a determination results switching circuits which selects determination results from one of said external address redundancy determining circuit and said internal address redundancy determining circuit, wherein the determination of said external address redundancy determining circuit and the determination of said at least one internal address redundancy determining circuit are performed in parallel.

3. A semiconductor memory device according to claim 2, further comprising a determination results switching circuit whereby the results of one of said external address redundancy determining circuit and internal address redundancy determining circuit are selected, depending upon the results of the mode determination.

4. A semiconductor memory device according to claim 1, further comprising at least one internal address generating circuit which automatically generates said internal address signal, wherein said redundancy determining circuit performs a determination of whether said address position specified by said external address signal is an exchanged position and a determination of whether said address position specified by :mid internal address signal is an exchanged position sequentially.

5. A semiconductor memory device according to claim 4, further comprising:

an input switching circuit which performs switching so that one of said external address signal and said at least one internal address signal is input to said redundancy determining circuit;

a determination result holding circuit which holds the results determined by said redundancy determining circuit; and a determination results switching circuit which selects one of the sequentially determined results from said redundancy determining circuit in accordance with the mode determination results.

6. A semiconductor memory device according to one of claim 4 and claim 5, wherein said internal address generating circuit generates, before the start of the next access cycle, a signal which indicates the next address to be accessed, and further said circuit shared by said plurality of modes performs, simultaneously with determination of the mode determining circuit, a determination of an address position specified by said external address signal is an exchanged memory cell, a determination of whether an address position specified by one of the internal address signals generated by said internal address generating circuit is an exchanged memory cell being made before said access cycle.

7. A semiconductor memory device having memory cells, comprising:

a mode determining circuit which performes a mode determination to determine one of a plurality of modes based on an external signal, said modes having a first mode in which one of the memory cells is selected in response to an external address signal and a second one mode in which one of the memory cells is selected in response to an internal address signal generated in the memory device;

an address-switching circuit selecting said external address signal or said internal address signal in response to said mode determined by said mode determining circuit; and a redundancy determining circuit receiving said external address signal which performs a determination to determine whether or not said external address signal is identical to a stored redundancy address, wherein at least part of said mode determination made by said mode determining circuit and at least part of the determination made by said redundancy determining circuit are performed in parallel.

* * * * *